(12) United States Patent
Hsu et al.

(10) Patent No.: US 10,014,341 B1
(45) Date of Patent: Jul. 3, 2018

(54) OPTICAL FINGERPRINT IDENTIFICATION MODULE

(71) Applicant: Primax Electronics Ltd., Taipei (TW)

(72) Inventors: Mao-Hsiu Hsu, Taipei (TW); Kuan-Pao Ting, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 0 days.

(21) Appl. No.: 15/790,773

(22) Filed: Oct. 23, 2017

(30) Foreign Application Priority Data

May 19, 2017 (TW) .............................. 106116688 A

(51) Int. Cl.
 G06K 9/00 (2006.01)
 H01L 27/146 (2006.01)
 F21V 8/00 (2006.01)

(52) U.S. Cl.
 CPC ...... *H01L 27/14678* (2013.01); *G02B 6/0036* (2013.01); *G02B 6/0051* (2013.01); *G02B 6/0053* (2013.01); *G02B 6/0055* (2013.01); *G02B 6/0068* (2013.01); *G02B 6/0083* (2013.01); *G06K 9/00046* (2013.01); *H01L 27/14618* (2013.01); *H01L 27/14625* (2013.01); *H01L 27/14629* (2013.01); *H01L 27/14636* (2013.01)

(58) Field of Classification Search
 CPC ..................... G06K 9/00046; G06K 9/2036
 See application file for complete search history.

(56) References Cited

U.S. PATENT DOCUMENTS

2008/0123908 A1* 5/2008 Waldman ........... G06K 9/00046
382/124

* cited by examiner

*Primary Examiner* — Thomas L Dickey
(74) *Attorney, Agent, or Firm* — Kirton McConkie; Evan R. Witt

(57) ABSTRACT

An optical fingerprint identification module includes a casing, an image pickup assembly, a light-guiding diffusion layer, a light-collecting reflective layer, a press plate, a light source and an optical tunnel structure. The optical tunnel structure is located under the press plate and located over the image pickup assembly. The optical tunnel structure is penetrated through the light-collecting reflective layer and a part of the light-guiding diffusion layer. After a light beam emitted by the light source is introduced into the light-guiding diffusion layer, the light beam is guided and diffused by the light-guiding diffusion layer and collected and reflected by the light-collecting reflective layer. Consequently, the light beam is transferred between the light-guiding diffusion layer and the light-collecting reflective layer. After the light beam is irradiated on the press plate through the optical tunnel structure, the light beam is reflected to the image pickup assembly.

10 Claims, 4 Drawing Sheets

OPTICAL FINGERPRINT IDENTIFICATION MODULE

FIELD OF THE INVENTION

The present invention relates to a fingerprint identification module, and more particularly to an optical fingerprint identification module, wherein the optical fingerprint identification module has a multilevel design for diffusing and collecting light beams and repeatedly refracting, reflecting, scattering and guiding, so that the light utilization efficiency is enhanced.

BACKGROUND OF THE INVENTION

Recently, biometric identification technologies are important subjects of various industries in order to ensure information security. As known, a fingerprint identification technology is one of the widely-used biometric identification technologies.

A fingerprint is a pattern composed of many curvy lines. In the enlarged view, these lines are lumpy because these lines comprise alternate ridges and valleys. A fingerprint feature indicates the distribution of these lumpy lines. Generally, everyone has the unique fingerprint feature. The uniqueness of the fingerprint feature can be used as a basis of recognizing the identity.

Conventionally, the fingerprint identification technology is divided into two types, i.e., a capacitive fingerprint identification technology and an optical fingerprint identification technology. According to the capacitive fingerprint identification technology, a capacitance sensor is used for sensing the charges' change, the temperature difference and the pressure of the finger in order to realize the structure of the fingerprint. The optical fingerprint identification technology directly captures the image of the fingerprint. After a light beam is irradiated on the user's finger to generate brightness contrast between the ridges and the valleys of the fingerprint, the fingerprint image is captured by an image pickup module and the fingerprint image is subsequently processed. Although the capacitive fingerprint identification module is slim and small, the cost of the capacitive fingerprint identification module is higher than the optical fingerprint identification module.

Since the space for storing the image or data of each fingerprint is not very large, the fingerprint identification module is gradually applied to the general mobile electronic device or notebook computer. The capacitive fingerprint identification module or the optical fingerprint identification module is used for acquiring the structure or image of the fingerprint. After the acquired structure or image of the fingerprint is calculated according to an algorithm and compared with the stored files, the user's identity is recognized.

Generally, the optical fingerprint identification module acquires the fingerprint image in a swiping manner or a pressing manner. While the finger is moved on the module in the swiping manner, plural images of the finger are captured. Then, the captured images are stitched as a complete fingerprint image by an application program. In the pressing manner, the module is directly pressed by the user's finger. After a certain time period, the fingerprint image is acquired.

Generally, the swiping-type fingerprint identification module is smaller and cheaper. Consequently, the swiping-type fingerprint identification module is suitably applied to the mobile electronic device. However, if the user's finger is not slid in the specified direction at a constant speed, the recognition result is possibly erroneous. The pressing-type fingerprint identification module provides an easy-to-use operation interface. Moreover, since the pressing-type fingerprint identification module acquires the complete fingerprint image through a one-time pressing action, a larger sensitive area is required. Since the fingerprint identification module with the larger sensitive area occupies much space of the mobile electronic device, the fabricating cost is higher.

FIG. 1 is a schematic cross-sectional view illustrating an optical press-type fingerprint identical module according to the prior art. As shown in FIG. 1, the fingerprint identical module 1 comprises an image pickup assembly 11, two light sources 121, 122, a light diffusion plate 13 and a press plate 10. When a finger A is placed on a surface 100 of the press plate 10, the press plate 10 can be pressed by the user. The two light sources 121 and 122 emit light beams. Moreover, the press plate 10 and the light diffusion plate 13 are light-transmissible. Consequently, the light beams can be transmitted through the press plate 10 and the light diffusion plate 13 and projected onto the finger A.

After the light beams are introduced into the light diffusion plate 13, the light beams are guided or refracted to the press plate 10 by the light diffusion plate 13. Consequently, an area light pattern is formed on the press plate 10. Moreover, the light diffusion plate 13 comprises an opening 130. After the light beams are irradiated on the finger A (especially the ridges of the fingerprint), the reflected light beams are transmitted through the opening 130. Consequently, the reflected light beams are received and imaged by the image pickup assembly 11.

As mentioned in FIG. 1 and as previously described, the press plate 10 should have a larger sensitive area in order to provide a one-time pressing action. However, because of the larger sensitive area, some drawbacks occur. For example, since the light beams are emitted by the light sources 121 and 122 at various angles, the light beams are not completely and centrally irradiated onto the finger A. That is, portions of the light beams are directly leaked out from the periphery of the press plate 10 that is located beside the finger A. Under this circumstance, the illuminating efficiency of the light source is impaired, and the imaging quality is adversely affected.

Since the optical fingerprint identification module is widely applied to the mobile electronic device, the user can operate the optical fingerprint identification module in an intuitive and simple manner. However, if the optical fingerprint identification module is costly or bulky and the image capturing efficacy is impaired, the competiveness of the optical fingerprint identification module in the market is reduced.

Therefore, there is a need of providing an improved optical fingerprint identification module so as to overcome the drawbacks of the conventional technologies.

SUMMARY OF THE INVENTION

The present invention provides an optical fingerprint identification module. The optical fingerprint identification module is a lateral lighting module. The optical fingerprint identification module has a multilevel design for diffusing and collecting light beams and repeatedly refracting, reflecting, scattering and guiding. Consequently, the light utilization efficiency is enhanced. Moreover, since the light beams are collected to the specified optical tunnel structure, the quality of the fingerprint image is enhanced.

In accordance with an aspect of the present invention, there is provided an optical fingerprint identification module. The optical fingerprint identification module includes a casing, an image pickup assembly, a light-guiding diffusion layer, a light-collecting reflective layer, a press plate, at least one light source and an optical tunnel structure. The image pickup assembly is disposed within the casing. The light-guiding diffusion layer is located over the image pickup assembly. The light-collecting reflective layer is located over the light-guiding diffusion layer. The press plate is disposed on the casing and located over the light-collecting reflective layer so as to be pressed. The at least one light source is arranged beside at least one lateral side of the light-guiding diffusion layer and the light-collecting reflective layer. The optical tunnel structure is located under the press plate and located over the image pickup assembly. The optical tunnel structure is penetrated through the light-collecting reflective layer and a part of the light-guiding diffusion layer, so that the light-collecting reflective layer and the part of the light-guiding diffusion layer are sheathed around the optical tunnel structure. After a light beam emitted by the at least one light source is introduced into the light-guiding diffusion layer, the light beam is guided and diffused by the light-guiding diffusion layer and collected and reflected by the light-collecting reflective layer, so that the light beam from the at least one light source is transferred between the light-guiding diffusion layer and the light-collecting reflective layer. After the light beam is irradiated on the press plate through the optical tunnel structure, the light beam is reflected to the image pickup assembly so as to be captured by the image pickup assembly.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
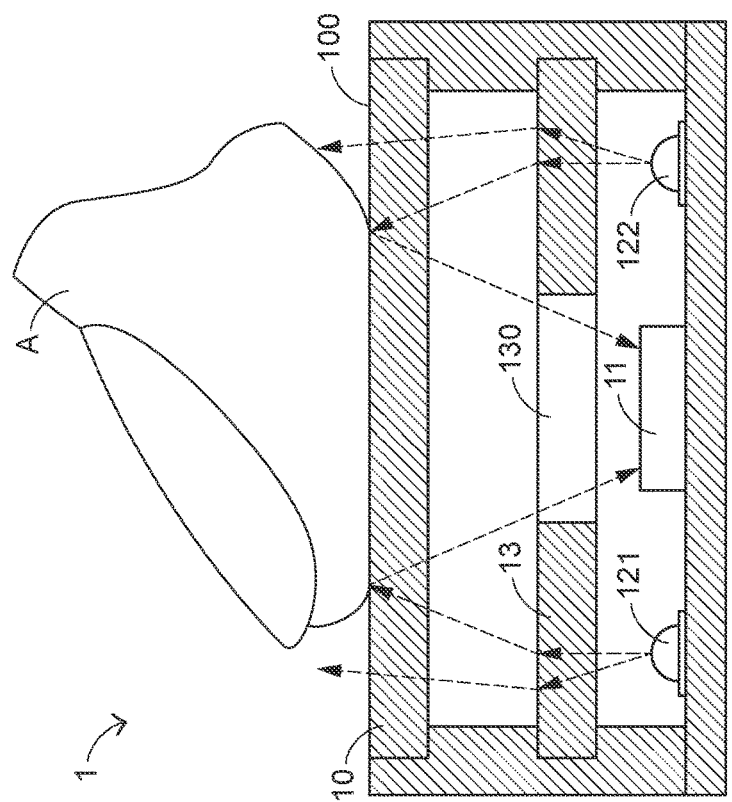
FIG. 1 is a schematic cross-sectional view illustrating an optical press-type fingerprint identical module according to the prior art.
Figure 2:
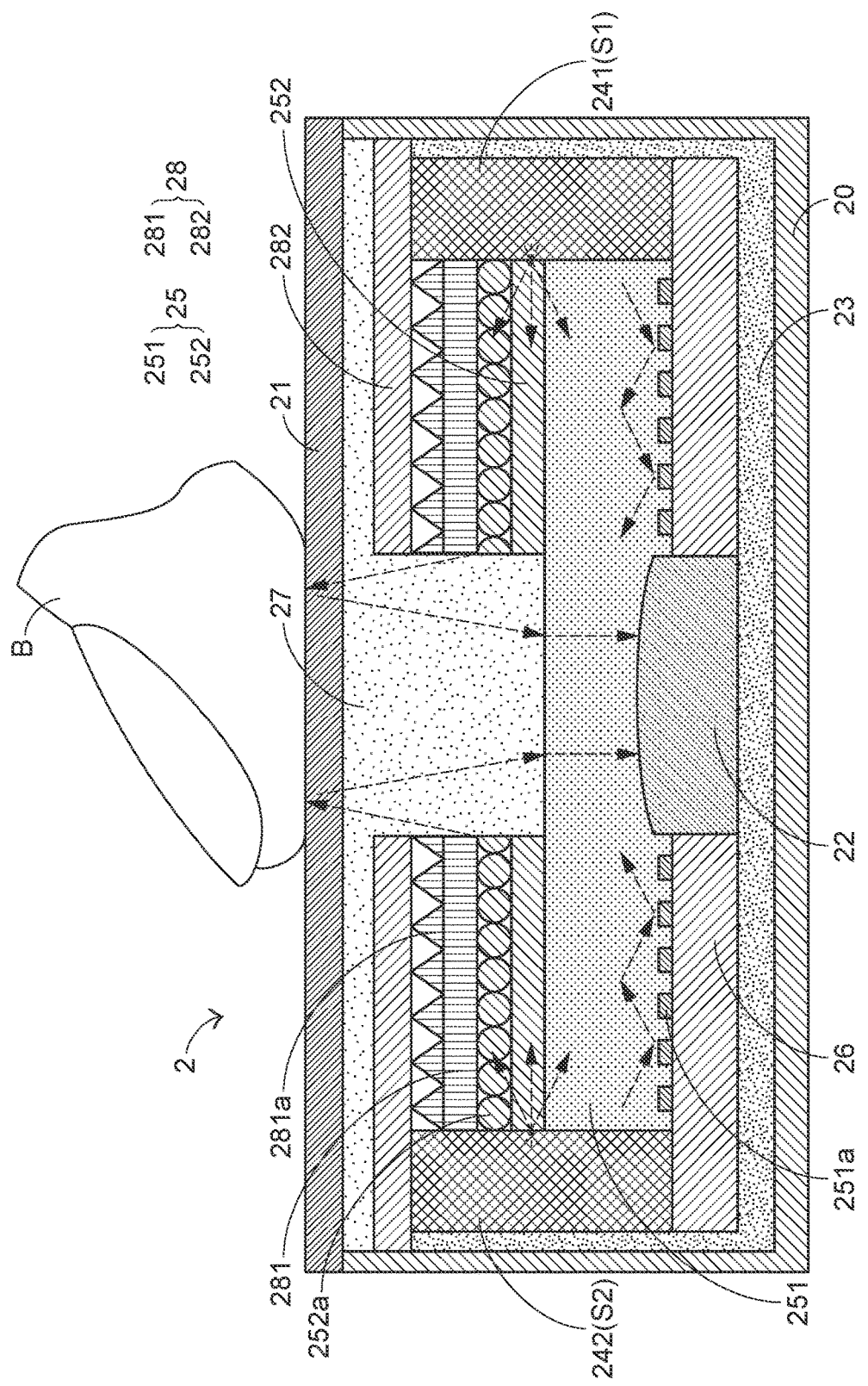
FIG. 2 is a schematic cross-sectional view illustrating an optical fingerprint identification module according to a first embodiment of the present invention.

An optical fingerprint identification module according to a first embodiment of the present invention will be described as follows. FIG. 2 is a schematic cross-sectional view illustrating an optical fingerprint identification module according to a first embodiment of the present invention. As shown in FIG. 2, the optical fingerprint identification module 2 comprises a casing 20, an image pickup assembly 22, a light-guiding diffusion layer 25, a light-collecting reflective layer 28, a press plate 21, two light sources 241, 242, an optical tunnel structure 27 and a lower reflector 26. In this embodiment, the optical fingerprint identification module 2 is installed in a mobile electronic device (not shown), but is not limited thereto. For example, the casing 20 is a part of a housing of the mobile electronic device according to the conventional production process. Alternatively, the casing is fixed in the mobile electronic device through an appropriate fixing means.

The relationships between the locations of these components are shown in FIG. 2. As shown in FIG. 2, most components or elements are disposed within the casing 20. Moreover, only the press plate 21 is disposed on the casing 20. A finger B may be placed on the press plate 21. For example, the press plate 21 is embedded in an entrance of the casing 20. The image pickup assembly 22 is disposed within the casing 20 and located at a lower position of the optical fingerprint identification module 2. The light-guiding diffusion layer 25 is located over the image pickup assembly 22. The light-collecting reflective layer 28 is located over the light-guiding diffusion layer 25. Moreover, the press plate 21 is located at the outermost layer and located over the light-collecting reflective layer 28.

The optical tunnel structure 27 is located under the press plate 21 and located over the image pickup assembly 22. That is, the optical tunnel structure 27 and the image pickup assembly 22 are aligned with each other along the vertical direction. The optical tunnel structure 27 is penetrated through the light-collecting reflective layer 28 and a part of the light-guiding diffusion layer 25. That is, the light-collecting reflective layer 28 and the part of the light-guiding diffusion layer 25 are sheathed around the optical tunnel structure 27. A process of forming the optical tunnel structure 27 will be described as follows. Firstly, a hollow channel with a specified diameter is formed in the light-collecting reflective layer 28 and a part of the light-guiding diffusion layer 25. Then, a specified material is filled into the hollow channel.

Preferably, the size of the specified diameter matches the size of the image pickup assembly 22. In addition, the size of the specified diameter is also determined according to the possible size of the general finger B. Alternatively, the size of the specified diameter is determined according to the way of acquiring the image (e.g., in the swiping manner or the pressing manner).

In this embodiment, the optical tunnel structure 27 is made of a light-transmissible material such as liquid optical clear adhesive (LOCA), i.e., the general UV curable adhesive. Consequently, the optical tunnel structure 27 is capable of combining with or fixing the adjacent components and providing the light-transmissible property. In the embodiment as shown in FIG. 2, the optical tunnel structure 27 is further extended to the region between the press plate 21 and the light-collecting reflective layer 28. Consequently, the adhesion between the associated components is enhanced. It is noted that numerous modifications and alterations may be made while retaining the teachings of the invention. For example, in another embodiment, the press plate and the light-collecting reflective layer are in contact with each other. Under this circumstance, the liquid optical clear adhesive is not filled into the region between the press plate and the light-collecting reflective layer.

Please refer to FIG. 2 again. The light-guiding diffusion layer 25 comprises a light guide plate 251 and a diffusion plate 252. The diffusion plate 252 is located over the light guide plate 251. The light-collecting reflective layer 28 comprises a light-collecting plate 281 and an upper reflector 282. The upper reflector 282 is located over the light-collecting plate 281. The upper reflector 282 and the extension part of the optical tunnel structure 27 are combined together. The light-collecting plate 281 is located over the light-guiding diffusion layer 25, especially the diffusion plate 252. As shown in FIG. 2, the lower reflector 26 is located under the light-guiding diffusion layer 25, especially the light guide plate 251. Moreover, the lower reflector 26 is arranged around the image pickup assembly 22.

The two light sources 241 and 242 are arranged beside the lateral sides S1 and S2 of the light-guiding diffusion layer 25 and the light-collecting reflective layer 28. In an embodiment, the light sources 241 and 242 are light bar assemblies. That is, each light bar comprises plural light emitting diodes. Moreover, the light sources 241 and 242 are linear light sources and closely attached on the lateral sides S1 and S2 of the light-guiding diffusion layer 25 and the light-collecting reflective layer 28. After the light beams are introduced into the light-guiding diffusion layer 25, the light beams are transferred within the light-guiding diffusion layer 25. Consequently, an area light pattern in a backlight form is generated. In other words, the optical fingerprint identification module 2 is a lateral-lighting fingerprint identification module. Consequently, the volume or thickness of the overall module is reduced.

As shown in FIG. 2, the top sides and the bottom sides of the light sources 241 and 242 are covered by the upper reflector 282 and the lower reflector 26 at the lateral sides S1 and S2. It is noted that numerous modifications and alterations may be made while retaining the teachings of the invention. For example, in another embodiment, the edges of the two light sources are in contact with the upper reflector and the lower reflector. Under this circumstance, the upper reflector, the light-collecting plate 281 and the diffusion plate 252 have the same width. Moreover, the arrangement of these components may be determined according to the type of the light bar as long as the light beams are not leaked out from the seams or the gaps between the junctions of the components.

The optical fingerprint identification module 2 further comprises a wiring structure 23. The wiring structure 23 is electrically connected with the image pickup assembly 22 and the light sources 241 and 242. The electric power and the electric signals can be transmitted through the wiring structure 23. In this embodiment, the wiring structure 23 is a flexible printed circuit board (FPCB). The wiring lines at the bottom side and the sidewall of the casing 20 are electrically connected with each other through the wiring structure 23. In the embodiment as shown in FIG. 2, the wiring structure 23 is completely covered by the casing 20. In some other embodiments, the casing 20 comprises a wiring hole (not shown), and the wiring structure 23 is penetrated through the wiring hole so as to be electrically connected with the circuit or component of the mobile electronic device.

In an embodiment, the image pickup assembly 22 comprises a processor, a memory, a camera lens, a transmission interface and any other appropriate component. It is noted that the components of the image pickup assembly 22 are not restricted. For example, in another embodiment, the image pickup assembly is not equipped with the processor and the memory. Under this circumstance, the image captured by the camera lens of the image pickup assembly is transmitted to a processing unit of the mobile electronic device so as to be processed.

As mentioned above, the optical fingerprint identification module 2 is designed to guide the light beams from the light sources 241 and 242 to the optical tunnel structure 27. After the light beams are emitted by the light sources 241 and 242, the possible directions and the possible optical paths of the light beams within the casing 20 are also shown in FIG. 2 and indicated by arrows. The examples of the optical paths include the reflected path, the transmitted path and the refracted path. In this embodiment, the light beams from the light sources 241 and 242 are guided and diffused by the light-guiding diffusion layer 25 and collected and reflected by the light-collecting reflective layer 28. Consequently, the light beams from the light sources 241 and 242 are transferred between the light-guiding diffusion layer 25 and the light-collecting reflective layer 28. After the light beams are irradiated on the press plate 21 through the optical tunnel structure 27, the light beams are reflected to the image pickup assembly 22 so as to be captured by the image pickup assembly 22.

In an embodiment, the light guide plate 251 comprises plural microstructures 251a for guiding the light beams. Consequently, the linear light pattern is formed as the area light pattern on the light-outputting surface of the light guide plate 251 (i.e., the interface between the light guide plate 251 and the diffusion plate 252, and the interface between the light guide plate 251 and the optical tunnel structure 27). In the embodiment of FIG. 2, the microstructures 251a have saw-toothed rectangular shapes. It is noted that the shapes of the microstructures 251a are not restricted. For example, in another embodiment, the microstructures 251a have spherical shapes or triangular cone shapes. As shown in FIG. 2, the microstructures 251a are discretely arranged at a regular interval. In some other embodiments, the microstructures 251a are discretely arranged at different intervals. For example, the spacing intervals between the microstructures are gradually decreased from the bilateral sides to the middle region.

Please refer to FIG. 2 again. The diffusion plate 252 further comprises plural diffusion particles 252a for diffusing the light beams. In an embodiment, the diffusion plate 252 is an optical diffuser for providing a uniform area light pattern. In an embodiment, plural spherical particles with high light-transmissible properties are dispersedly coated or imprinted on a substrate (e.g., a PET substrate) in order to be formed as the diffusion particles. The sizes of the spherical particles may be different. After the light beams are transmitted through the diffusion plate 252, the light beams are refracted or scattered by the media with two different refraction indexes. Consequently, the light beams generate an optical diffusion effect.

Please refer to FIG. 2 again. The light-collecting plate 281 comprises plural prism structures 281a for collecting the light beams. In an embodiment, the light-collecting plate 281 is a prism film (also referred as a brightness enhancement film or a light enhancement film) for centralizing the light intensity in order to enhance the brightness or the luminance. For example, a row of triangular structures are averagely imprinted on the light-outputting surface of a substrate (e.g., a PET substrate) in order to be formed as the prism structures. The sizes of the triangular structures may be different. After the light beams are transmitted through the light-collecting plate 281, the light beams are refracted and reflected along specified directions. Consequently, the light intensity distribution is adjusted. Since the light beams are centralized and recycled, the loss of the light amount is reduced and the brightness or luminance is enhanced.

Figure 3A:
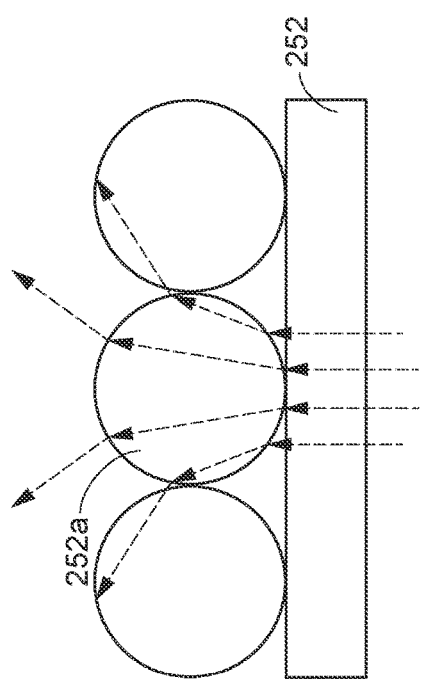
FIG. 3A schematically illustrates the possible optical paths of the light beams through the diffusion plate.
Figure 3B:
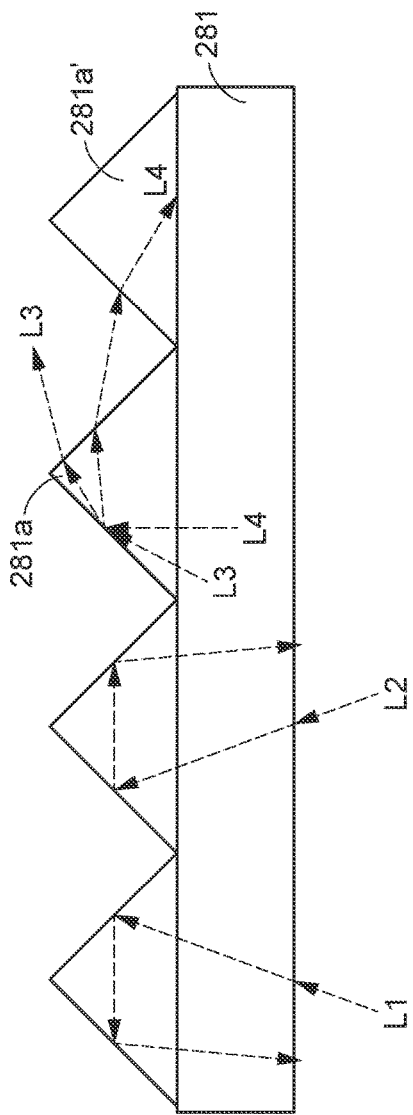
FIG. 3B schematically illustrates the possible optical paths of the light beams through the light-collecting plate.

Please refer to FIGS. 3A and 3B. FIG. 3A schematically illustrates the possible optical paths of the light beams through the diffusion plate. FIG. 3B schematically illustrates the possible optical paths of the light beams through the light-collecting plate.

As shown in FIG. 3A, the diffusion particles 252a have the same size. The light beams are perpendicularly introduced into the diffusion plate 252. After the light beams are introduced into the diffusion plate 252, the light beams are refracted by the diffusion particles 252a. Since the light beams are refracted at different positions, the position and the directions of the light beams outputted from the diffusion particles 252a are different. Under this circumstance, the overall diffraction angle of the incident light beams is increased. Since the light beams can be introduced into the diffusion plate 252 at various angles, the diffusion efficacy of the diffusion plate 252 is enhanced after the light beams are uniformly formed as the area light pattern by the light guide plate 251.

As shown in FIG. 3B, the plural prism structures (e.g., the prism structure 281a and the prism structure 281a') of the light-collecting plate 281 have the same size. Moreover, plural light beams L1~L4 are introduced into the light-collecting plate 281 at different angles. After the light beams L1~L4 are introduced into different prism structures, the light beams are reflected or refracted at different angles. For example, the light beam L1 is introduced into the light-collecting plate 281 from a lower left side and reflected in the direction toward the original position. The light beam L2 is introduced into the light-collecting plate 281 from a lower right side and reflected in the direction toward the original position. The light beam L3 is refracted by the prism structure 281a and outputted in the upward direction. The light beam L4 is refracted by the prism structure 281a and introduced into the adjacent prism structure 281a'. Then, the light beam L4 is refracted along the lower right direction by the prism structure 281a'.

As mentioned in FIGS. 2 and 3B, the light beams from the light-guiding diffusion layer 25 (especially the light guide plate 251) are reflected by the lower reflector 26. After the light beams L1, L2 and L4 are reflected and refracted for several times, these light beams are returned back to the light-guiding diffusion layer 25 and diffused or guided by the diffusion plate 252 and the light guide plate 251. After the light beam L3 is transmitted through the light-collecting plate 281 (especially the prism structure 281a), the light beam L3 is reflected by the upper reflector 282. After the light beam L3 is reflected and refracted for several times, the light beam L3 is returned back to the light-collecting reflective layer 28 and the light-guiding diffusion layer 25. Consequently, the light amount at the upper portion or the lower portion is not easily lost.

Before the light beams of the light sources 241 and 242 are outputted from the casing 20 (i.e., the position of the optical tunnel structure 27), the light beams are still retained within the casing 20. Since the light beams are diffused and collected through reflection and refraction, the light beams within the casing 20 are readily directed to the optical tunnel structure 27.

In this embodiment, the optical tunnel structure 27 is made of the liquid optical clear adhesive. The refraction index of the liquid optical clear adhesive is in the range between 1.50 and 1.54. Consequently, after the light beams are introduced into the optical tunnel structure 27 through the light guide plate 251, the diffusion plate 252 or the light-collecting plate 281, the light beams are refracted by the optical tunnel structure 27. Consequently, the light beams are outputted from the optical tunnel structure 27 and irradiated on the press plate 21 at suitable angles. That is, the light beams are irradiated on the finger B over the optical tunnel structure 27. After the finger B is shot by the image pickup assembly 22, a fingerprint image is acquired.

According to the practical requirements, the types of the light sources 241 and 242 may be different. For example, the light source is a light emitting diode (LED) for emitting a visible light beam, or the light source is a light emitting diode for emitting an invisible light beam (e.g., an IR beam). Depending on the type of the light source, the image pickup assembly is arranged according to a manner of sensing the visible light beam or the invisible light beam.

In an embodiment, the upper reflector 282 and the lower reflector 26 are reflection films for highly reflecting the light beams. For example, each of the upper reflector 282 and the lower reflector 26 is formed by depositing a reflective material on a surface of a substrate. An example of the reflective material includes but is not limited to silver or aluminum.

It is noted that numerous modifications and alterations may be made while retaining the teachings of the invention. For example, in another embodiment, the light guide plate 251 comprises plural microstructures 251a for reflecting the light beams but the lower reflector 26 is omitted. Under this circumstance, the efficacy of reflecting the light beams is possibly reduced. However, since the casing 20 is made of the material with high reflectivity, the light beams are not excessively leaked out and the illuminating efficacy is maintained.

In some other embodiments, the light source is located at a single side. That is, only one of the light source 241 and the light source 242 is used. For producing better light-guiding efficacy and enhanced illuminating efficacy, the optical tunnel structure 27 is arranged in the middle of the two light sources 241 and 242 (see FIG. 2). Consequently, the accumulated light amount is optimized. In case that a single light source is used, the optical tunnel structure is separated from the light source by a specified distance. That is, the optical tunnel structure is located at another side close to the casing. Consequently, the accumulated light amount is optimized.

Figure 4:
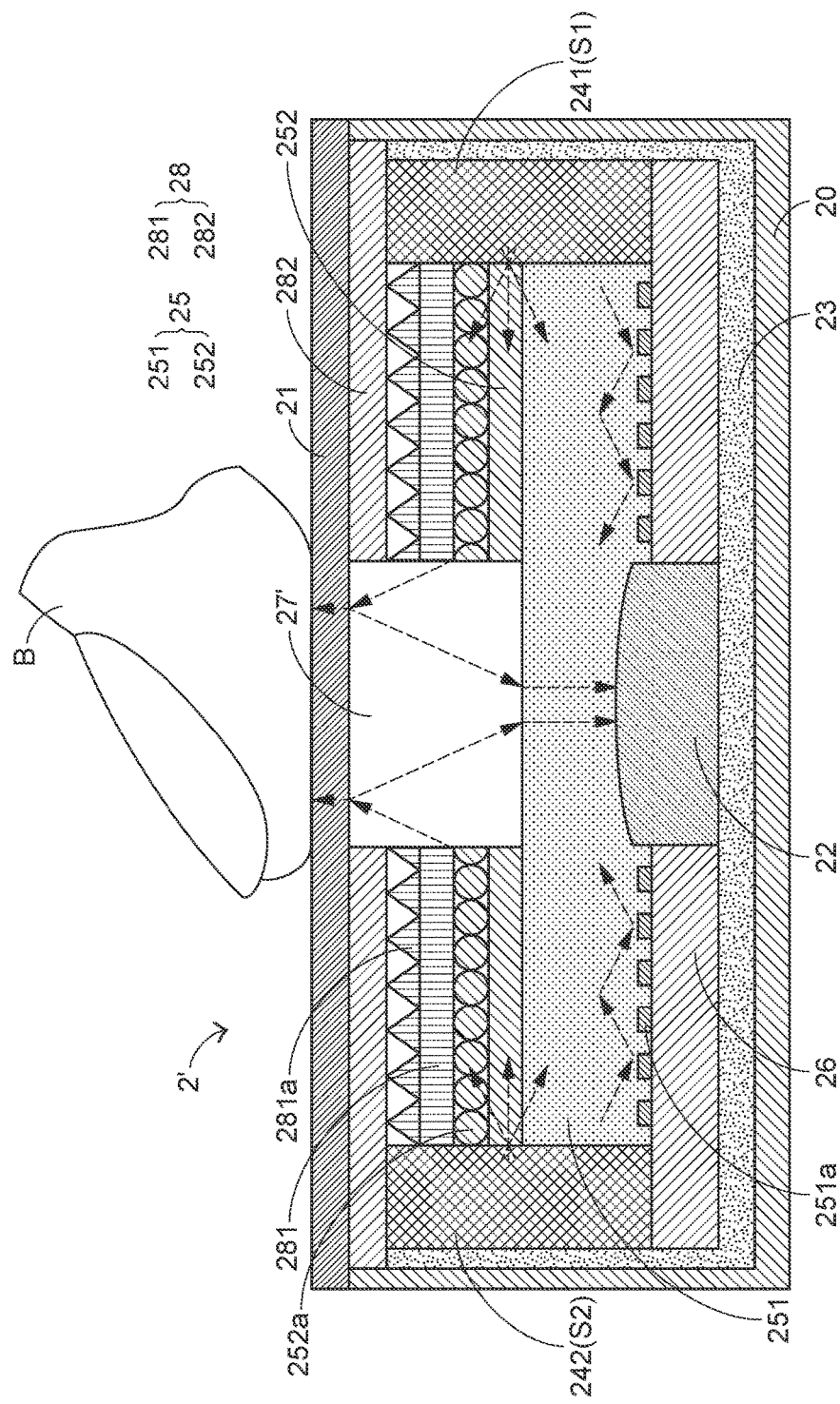
FIG. 4 is a schematic cross-sectional view illustrating an optical fingerprint identification module according to a second embodiment of the present invention.

An optical fingerprint identification module according to a second embodiment of the present invention will be described as follows. FIG. 4 is a schematic cross-sectional view illustrating an optical fingerprint identification module 2' according to a second embodiment of the present invention. In comparison with the first embodiment, the optical tunnel structure 27' of this embodiment is a hollow channel structure. That is, after the channel structure is formed in the light-collecting reflective layer and a part of the light-guiding diffusion layer, no material is filled into the channel structure.

As mentioned above, the optical tunnel structure 27' of this embodiment is a channel structure. The periphery of the optical tunnel structure 27' is not extended to the region between the press plate 21 and the upper reflector 282. That is, the upper reflector 282 is in direct contact with the press plate 21. In some other embodiments, the upper reflector and the press plate are combined together through an adhesive. The adhesive is not necessarily a light-transmissible material. However, the adhesive has an opening corresponding to the optical tunnel structure 27'.

In this embodiment, the material with the high refraction index is not filled into the optical tunnel structure 27'. That is, air is the only medium within the optical tunnel structure 27'. Consequently, in comparison with the first embodiment, the way of refracting the light beams is distinguished. In case that the optical tunnel structure contains any light-transmissible material (e.g., glass or adhesive), the intensity of the light beam is attenuated. After the light beams are transmitted through the optical tunnel structure, the light beams are possibly suffered from power loss. Since the optical tunnel structure 27' as shown in FIG. 4 is a channel structure, the light beams are irradiated on the press plate 21 at optimized performance. Since the illuminating efficacy is increased, the quality of the fingerprint image is enhanced.

Moreover, the first embodiment and the second embodiment may be further modified. For example, the depth of the hollow channel of the optical tunnel structure is changed. In some other embodiments, the optical tunnel structure is penetrated though the light-collecting reflective layer only but not penetrated through the light-guiding diffusion layer. In this light-guiding diffusion layer, the entire of the diffusion plate is located over the light guide plate. Since the optical tunnel structure is located over the light-guiding diffusion layer, the optical tunnel structure is sheathed by the light-collecting reflective layer.

In the variant example of the light-guiding diffusion layer, the light beams (especially the light beams from the light guide plate under the diffusion plate) are diffused by the plural diffusion particles. Then, the diffused light beams are directly introduced into the optical tunnel structure. Even if the way of guiding the light beams is different from that of the first embodiment or the second embodiment, the illuminating efficacy and the quality of the fingerprint image are also satisfactory.

From the above descriptions, the present invention provides a fingerprint identification module, and especially an optical fingerprint identification module. The optical fingerprint identification module is applicable to the existing mobile electronic device. Regardless of whether the fingerprint image is acquired in the swiping manner or the pressing manner, the optical fingerprint identification module of the present invention is feasible. Moreover, the optical fingerprint identification module of the present invention has the following benefits. Firstly, since the optical fingerprint identification module is a lateral lighting module, the thickness of the overall module is effectively reduced. Secondly, the optical fingerprint identification module has a multilevel design for diffusing and collecting light beams and repeatedly refracting, reflecting, scattering and guiding. Consequently, the light utilization efficiency is enhanced. Thirdly, since the light beams are collected to the specified optical tunnel structure, the quality of the fingerprint image is enhanced.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. An optical fingerprint identification module, comprising:
   a casing;
   an image pickup assembly disposed within the casing;
   a light-guiding diffusion layer located over the image pickup assembly;
   a light-collecting reflective layer located over the light-guiding diffusion layer;
   a press plate disposed on the casing and located over the light-collecting reflective layer so as to be pressed;
   at least one light source arranged beside at least one lateral side of the light-guiding diffusion layer and the light-collecting reflective layer; and
   an optical tunnel structure located under the press plate, and located over the image pickup assembly, wherein the optical tunnel structure is penetrated through the light-collecting reflective layer and a part of the light-guiding diffusion layer, so that the light-collecting reflective layer and the part of the light-guiding diffusion layer are sheathed around the optical tunnel structure,
   wherein after a light beam emitted by the at least one light source is introduced into the light-guiding diffusion layer, the light beam is guided and diffused by the light-guiding diffusion layer and collected and reflected by the light-collecting reflective layer, so that the light beam from the at least one light source is transferred between the light-guiding diffusion layer and the light-collecting reflective layer, wherein after the light beam is irradiated on the press plate through the optical tunnel structure, the light beam is reflected to the image pickup assembly so as to be captured by the image pickup assembly.

2. The optical fingerprint identification module according to claim 1, further comprising a wiring structure, wherein the wiring structure is electrically connected with the image pickup assembly and the at least one light source, and electric power and electric signals are transmitted through the wiring structure.

3. The optical fingerprint identification module according to claim 1, further comprising a lower reflector, wherein the lower reflector is located under the light-guiding diffusion layer and arranged around the image pickup assembly, wherein after the light beam is transmitted through the light-guiding diffusion layer, the light beam is reflected by the lower reflector.

4. The optical fingerprint identification module according to claim 1, wherein the light-guiding diffusion layer comprises:
   a light guide plate comprising plural microstructures, wherein the light beam from the at least one light source is guided by the plural microstructures; and
   a diffusion plate located over the light guide plate, wherein the diffusion plate comprises plural diffusion particles, and the light beam from the at least one light source is diffused by the plural diffusion particles.

5. The optical fingerprint identification module according to claim 1, wherein the light-collecting reflective layer comprises:
   a light-collecting plate located over the light-guiding diffusion layer, wherein the light-collecting plate comprises plural prism structures, and the light beam from the at least one light source is collected by the light-collecting plate; and
   an upper reflector located over the light-collecting plate, wherein after the light beam is transmitted through the light-collecting plate, the light beam is reflected by the upper reflector.

6. The optical fingerprint identification module according to claim 1, wherein the optical tunnel structure is made of a light-transmissible material, and the optical tunnel structure is further extended to a region between the press plate and the light-collecting reflective layer.

7. The optical fingerprint identification module according to claim 6, wherein the light-transmissible material is a liquid optical clear adhesive, and a refraction index of the liquid optical clear adhesive is in a range between 1.50 and 1.54.

8. The optical fingerprint identification module according to claim 1, wherein the optical tunnel structure is a channel structure.

9. The optical fingerprint identification module according to claim 1, wherein the light beam from the at least one light source is a visible light beam or an invisible light beam, and the image pickup assembly is arranged according to a manner of sensing the visible light beam or the invisible light beam.

10. An optical fingerprint identification module, comprising:
   a casing;
   an image pickup assembly disposed within the casing;
   a light-guiding diffusion layer located over the image pickup assembly;
   a light-collecting reflective layer located over the light-guiding diffusion layer;
   a press plate disposed on the casing and located over the light-collecting reflective layer so as to be pressed;
   at least one light source arranged beside at least one lateral side of the light-guiding diffusion layer and the light-collecting reflective layer; and
   an optical tunnel structure located under the press plate, and located over the image pickup assembly and the light-guiding diffusion layer, wherein the optical tunnel structure is penetrated through the light-collecting reflective layer, so that the light-collecting reflective layer is sheathed around the optical tunnel structure,
   wherein after a light beam emitted by the at least one light source is introduced into the light-guiding diffusion layer, the light beam is guided and diffused by the light-guiding diffusion layer and collected and reflected by the light-collecting reflective layer, so that the light beam from the at least one light source is transferred between the light-guiding diffusion layer and the light-collecting reflective layer, wherein after the light beam is irradiated on the press plate through the optical tunnel structure, the light beam is reflected to the image pickup assembly so as to be captured by the image pickup assembly.

* * * * *